United States Patent
Knoll et al.

(10) Patent No.: US 7,365,271 B2
(45) Date of Patent: Apr. 29, 2008

(54) SUPERCONDUCTING ARTICLES, AND METHODS FOR FORMING AND USING SAME

(75) Inventors: Allan Robert Knoll, Duanesburg, NY (US); Venkat Selvamanickam, Wynantskill, NY (US); Chandra Reis, Altamont, NY (US)

(73) Assignee: Superpower, Inc., Schenectady, NY (US)

( * ) Notice: Subject to any disclaimer, the term of this patent is extended or adjusted under 35 U.S.C. 154(b) by 0 days.

(21) Appl. No.: 10/750,144

(22) Filed: Dec. 31, 2003

(65) Prior Publication Data

US 2005/0139380 A1 Jun. 30, 2005

(51) Int. Cl.
*H01B 12/00* (2006.01)
(52) U.S. Cl. ................... 174/125.1; 505/230
(58) Field of Classification Search ....... 174/15.4, 174/15.5, 125.1; 29/599; 505/230–232, 505/430–432, 234, 329
See application file for complete search history.

(56) References Cited

U.S. PATENT DOCUMENTS

| | | | |
|---|---|---|---|
| 5,051,397 A | | 9/1991 | Sato et al. |
| 5,077,266 A | * | 12/1991 | Takagi et al. ............. 505/329 |
| 5,358,929 A | * | 10/1994 | Fujikami et al. .......... 505/100 |
| 5,527,766 A | | 6/1996 | Eddy |
| 5,650,377 A | | 7/1997 | Kern et al. |
| 5,932,523 A | | 8/1999 | Fujikami et al. |
| 6,133,814 A | * | 10/2000 | Okada et al. ............. 335/216 |
| 6,388,268 B1 | | 5/2002 | Kim et al. |
| 6,436,317 B1 | * | 8/2002 | Malozemoff et al. ..... 252/519.1 |
| 6,576,843 B1 | * | 6/2003 | Ashworth ............... 174/125.1 |
| 6,765,151 B2 | | 7/2004 | Fritzemeier et al. |
| 6,794,970 B2 | * | 9/2004 | Reis et al. ............... 335/216 |
| 2004/0020683 A1 | * | 2/2004 | Perez et al. ............. 174/125.1 |
| 2004/0256126 A1 | | 12/2004 | Ashibe et al. |
| 2004/0266628 A1 | * | 12/2004 | Lee et al. ................ 505/238 |
| 2006/0175078 A1 | | 8/2006 | Yumura et al. |

FOREIGN PATENT DOCUMENTS

| | | | |
|---|---|---|---|
| JP | 1-107582 | * | 4/1989 |
| JP | 3-283679 | | 12/1991 |
| JP | 6-85337 | | 3/1994 |
| JP | 2000-261053 | | 9/2000 |
| JP | 2001-168404 | | 6/2001 |
| WO | WO 01/08232 A2 | | 2/2001 |
| WO | WO 01/18885 A1 | | 3/2001 |
| WO | WO 01/26165 A2 | | 4/2001 |

OTHER PUBLICATIONS

Machine Translation of the abstract of JP 1-107582.*
Pedamig, J.D., et al., "Patterning of YBa2Cu307—Films using a Near-Field Optical Configuration", Appl. Phys. A., vol. 67, pp. 403-405, 1998.

(Continued)

*Primary Examiner*—Jeremy C Norris
(74) *Attorney, Agent, or Firm*—Larson Newman Abel Polansky & White, LLP

(57) ABSTRACT

A superconducting tape includes a substrate, a buffer layer overlying the substrate, a superconductor layer overlying the buffer layer, and an electroplated stabilizer layer overlying the superconductor layer. The tape provides for low AC losses, and is particularly suitable for deployment in components where attenuation of AC losses is important, such as in rotating machines.

24 Claims, 4 Drawing Sheets

OTHER PUBLICATIONS

Cobb, Coleman B., et al., "Hysteretic Loss Reduction in Striated YBCO", Physica C., vol. 382, pp. 52-56, 2002.

Carr, Jr., W.J., et al., "Filamentary YBCO Conductors for AC Applications", IEEE Transactions on Applied Superconductivity, vol. 9, No. 2, pp. 1475-1478, Jun. 1999.

Sumption, M.D., et al., Hysteretic Loss vs. Filament Width in Thin YBCO Films Near the Penetration Field, IEEE Transactions on Applied Superconductivity, vol. 13., No. 2, pp. 3553-3556, Jun. 2003.

Suzuki, Y., "Transport Properties of Patterned Thin Lines From Epitaxial YBCO", Cornell Nanofabrication Facility, National Nabnofabrication Users Network, pp. 178-179.

Meltaus, J., et al., "High Temperature Superconducting Thin-Film Patterning for Microwave Applications", Materials Physics Laboratory, Helsinki University of Technology, 1 pg.

Hakola, A., "Patterning of HTS Thin Films", Department of Engineering Physics and Mathematics, Helsinki University of Technology, http://www.hut.fi/Units/AES/projects/prlaser/patterning.htm, 2 pgs.

"State-of-the-art of the HTS Microfabrication Technology", http://www.imel.demokritos.gr/web/NATO_973718/Proposal/stateoftheart_ofHTStechnol . . . , 4 pgs, Jul. 17, 2003.

Tralshawata, N., et al., "Session K20—Industrial Applications of High-Temperature Superconductor Materials", Mixed Session, Wednesday afternoon, Mar. 19, 5 pgs.

* cited by examiner

SUPERCONDUCTING ARTICLES, AND METHODS FOR FORMING AND USING SAME

CROSS-REFERENCE TO RELATED APPLICATION(S)

BACKGROUND

1. Field of the Invention

The present invention is generally directed to superconductor articles and methods for forming same. The invention is particularly related to superconductor articles in the form of coated conductors, and devices incorporating same.

2. Description of the Related Art

Superconductor materials have long been known and understood by the technical community. Low-temperature (low-$T_c$) superconductors exhibiting superconductive properties at temperatures requiring use of liquid helium (4.2 K), have been known since about 1911. However, it was not until somewhat recently that oxide-based high-temperature (high-$T_c$) superconductors have been discovered. Around 1986, a first high-temperature superconductor (HTS), having superconductive properties at a temperature above that of liquid nitrogen (77 K) was discovered, namely $YBa_2Cu_3O_{7-x}$ (YBCO), followed by development of additional materials over the past 15 years including $Bi_2Sr_2Ca_2Cu_3O_{10+y}$ (BSCCO), and others. The development of high-$T_c$ superconductors has created the potential of economically feasible development of superconductor components incorporating such materials, due partly to the cost of operating such superconductors with liquid nitrogen rather than the comparatively more expensive cryogenic infrastructure based on liquid helium.

Of the myriad of potential applications, the industry has sought to develop use of such materials in the power industry, including applications for power generation, transmission, distribution, and storage. In this regard, it is estimated that the native resistance of copper-based commercial power components is responsible for billions of dollars per year in losses of electricity, and accordingly, the power industry stands to gain based upon utilization of high-temperature superconductors in power components such as transmission and distribution power cables, generators, transformers, and fault current interrupters. In addition, other benefits of high-temperature superconductors in the power industry include a factor of 3-10 increase of power-handling capacity, significant reduction in the size (i.e., footprint) of electric power equipment, reduced environmental impact, greater safety, and increased capacity over conventional technology. While such potential benefits of high-temperature superconductors remain quite compelling, numerous technical challenges continue to exist in the production and commercialization of high-temperature superconductors on a large scale.

Among the challenges associated with the commercialization of high-temperature superconductors, many exist around the fabrication of a superconducting tape that can be utilized for formation of various power components. A first generation of superconducting tape includes use of the above-mentioned BSCCO high-temperature superconductor. This material is generally provided in the form of discrete filaments, which are embedded in a matrix of noble metal, typically silver. Although such conductors may be made in extended lengths needed for implementation into the power industry (such as on the order of kilometers), due to materials and manufacturing costs, such tapes do not represent a commercially feasible product.

Accordingly, a great deal of interest has been generated in the so-called second-generation HTS tapes that have superior commercial viability. These tapes typically rely on a layered structure, generally including a flexible substrate that provides mechanical support, at least one buffer layer overlying the substrate, the buffer layer optionally containing multiple films, an HTS layer overlying the buffer film, and an electrical stabilizer layer overlying the superconductor layer, typically formed of at least a noble metal. However, to date, numerous engineering and manufacturing challenges remain prior to full commercialization of such second generation-tapes.

Accordingly, in view of the foregoing, various needs continue to exist in the art of superconductors, and in particular, provision of commercially viable superconducting tapes, methods for forming same, and power components utilizing such superconducting tapes.

In addition to the general needs in the art discussed above, it is also advantageous to provide superconductive articles that have desirable operating characteristics in the context of applications in which AC losses are of particular significance. In this regard, the most typical form of electric power utilized today is an alternating current (AC) form. Superconductive articles, including conductors that are coiled or wound are particularly subject to AC losses, inhibiting commercial viability.

SUMMARY

According to a first aspect of the present invention, a superconducting article is provided, which includes a substrate, a plurality of superconductor strips overlying the substrate, the superconductor strips having first and second superconductor strips adjacent each other, and at least one conductive bridge electrically coupling at least the first and second conductive strips with each other. Generally, the substrate has a dimension ratio of not less than about 10.

According to another aspect of the present invention, a method for forming a superconducting tape is provided, which includes providing a substrate, depositing a superconductor layer overlying the substrate, the substrate having a dimension ratio of not less than $10^2$, and patterning the superconductor layer by photolithography.

DETAILED DESCRIPTION

Figure 1:
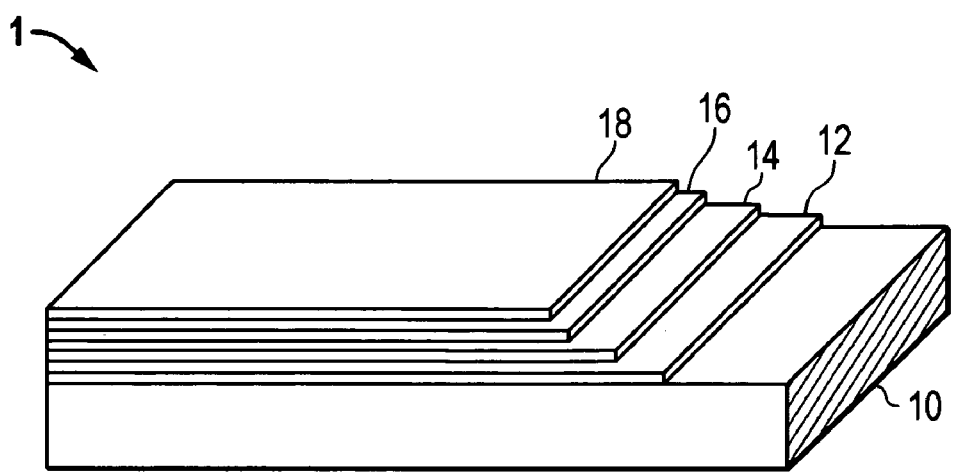
FIG. 1 illustrates a perspective view showing the generalized structure of a superconducting tape according to an embodiment of the present invention.

Turning to FIG. 1, the general layered structure of a superconductive article according to an embodiment of the present invention is depicted. The superconductive article includes a substrate 10, a buffer layer 12 overlying the substrate 10, a superconductor layer 14, followed by a capping layer 16 (optional), typically a noble metal layer, and a stabilizer layer 18 (optional), typically a non-noble metal.

The substrate 10 is generally metal-based, and typically, an alloy of at least two metallic elements. Particularly suitable substrate materials include nickel-based metal alloys such as the known Inconel® group of alloys. The Inconel® alloys tend to have desirable creep, chemical and mechanical properties, including coefficient of expansion, tensile strength, yield strength, and elongation. These metals are generally commercially available in the form of spooled tapes, particularly suitable for superconductor tape fabrication, which typically will utilize reel-to-reel tape handling.

The substrate 10 is typically in a tape-like configuration, having a high dimension ratio. For example, the width of the tape is generally on the order of about 0.4-10 cm, and the length of the tape is typically at least about 100 m, most typically greater than about 500 m. Indeed, embodiments of the present invention provide for superconducting tapes that include substrate 10 having a length on the order of 1 km or above. Accordingly, the substrate may have a dimension ratio which is fairly high, on the order of not less than 10, not less than about $10^2$, or even not less than about $10^3$. Certain embodiments are longer, having a dimension ratio of $10^4$ and higher. As used herein, the term 'dimension ratio' is used to denote the ratio of the length of the substrate or tape to the next longest dimension, the width of the substrate or tape.

In one embodiment, the substrate is treated so as to have desirable surface properties for subsequent deposition of the constituent layers of the superconductor tape. For example, the surface may be lightly polished to a desired flatness and surface roughness. Additionally, the substrate may be treated to be biaxially textured as is understood in the art, such as by the known RABiTS (roll assisted biaxially textured substrate) technique.

Turning to the buffer layer 12, the buffer layer may be a single layer, or more commonly, be made up of several films. Most typically, the buffer layer includes a biaxially textured film, having a crystalline texture that is generally aligned along crystal axes both in-plane and out-of-plane of the film. Such biaxial texturing may be accomplished by IBAD. As is understood in the art, IBAD is acronym that stands for ion beam assisted deposition, a technique that may be advantageously utilized to form a suitably textured buffer layer for subsequent formation of an superconductor layer having desirable crystallographic orientation for superior superconducting properties. Magnesium oxide is a typical material of choice for the IBAD film, and may be on the order or 50 to 500 Angstroms, such as 50 to 200 Angstroms. Generally, the IBAD film has a rock-salt like crystal structure, as defined and described in U.S. Pat. No. 6,190,752, incorporated herein by reference.

The buffer layer may include additional films, such as a barrier film provided to directly contact and be placed in between an IBAD film and the substrate. In this regard, the barrier film may advantageously be formed of an oxide, such as yttria, and functions to isolate the substrate from the IBAD film. A barrier film may also be formed of non-oxides such as silicon nitride. Suitable techniques for deposition of a barrier film include chemical vapor deposition and physical vapor deposition including sputtering. Typical thicknesses of the barrier film may be within a range of about 100-200 Angstroms. Still further, the buffer layer may also include an epitaxially grown film, formed over the IBAD film. In this context, the epitaxially grown film is effective to increase the thickness of the IBAD film, and may desirably be made principally of the same material utilized for the IBAD layer such as MgO.

In embodiments utilizing an MgO-based IBAD film and/or epitaxial film, a lattice mismatch between the MgO material and the material of the superconductor layer exists. Accordingly, the buffer layer may further include another buffer film, this one in particular implemented to reduce a mismatch in lattice constants between the superconductor layer and the underlying IBAD film and/or epitaxial film. This buffer film may be formed of materials such as YSZ (yttria-stabilized zirconia) strontium ruthenate, lanthanum manganate, and generally, perovskite-structured ceramic materials. The buffer film may be deposited by various physical vapor deposition techniques.

While the foregoing has principally focused on implementation of a biaxially textured film in the buffer stack (layer) by a texturing process such as IBAD, alternatively, the substrate surface itself may be biaxially textured. In this case, the buffer layer is generally epitaxially grown on the textured substrate so as to preserve biaxial texturing in the buffer layer. One process for forming a biaxially textured substrate is the process known in the art as RABiTS (roll assisted biaxially textured substrates), generally understood in the art.

The superconductor layer 14 is generally in the form of a high-temperature superconductor (HTS) layer. HTS materials are typically chosen from any of the high-temperature superconducting materials that exhibit superconducting properties above the temperature of liquid nitrogen, 77 K. Such materials may include, for example, $YBa_2Cu_3O_{7-x}$, $Bi_2Sr_2Ca_2Cu_3O_{10+y}$, $Ti_2Ba_2Ca_2Cu_3O_{10+y}$, and $HgBa_2Ca_2Cu_3O_{8+y}$. One class of materials includes $REBa_2Cu_3O_{7-x}$, wherein RE is a rare earth element. Of the foregoing, $YBa_2Cu_3O_{7-x}$, also generally referred to as YBCO, may be advantageously utilized. The superconductor layer 14 may be formed by any one of various techniques, including thick and thin film forming techniques. Preferably, a thin film physical vapor deposition technique such as pulsed laser deposition (PLD) can be used for a high deposition rates, or a chemical vapor deposition technique can be used for lower cost and larger surface area treatment. Typically, the superconductor layer has a thickness on the order of about 1 to about 30 microns, most typically about 2 to about 20 microns, such as about 2 to about 10 microns, in order to get desirable amperage ratings associated with the superconductor layer 14.

The capping layer 16 and the stabilizer layer 18 are generally implemented to provide a low resistance interface and for electrical stabilization to aid in prevention of superconductor burnout in practical use. More particularly, layers 16 and 18 aid in continued flow of electrical charges along the superconductor in cases where cooling fails or the critical current density is exceeded, and the superconductor layer moves from the superconducting state and becomes resistive. Typically, a noble metal is utilized for capping layer 16 to prevent unwanted interaction between the stabilizer layer(s) and the superconductor layer 14. Typical noble metals include gold, silver, platinum, and palladium. Silver is typically used due to its cost and general accessibility. The capping layer 16 is typically made to be thick enough to prevent unwanted diffusion of the components from the stabilizer layer 18 into the superconductor layer 14, but is made to be generally thin for cost reasons (raw material and processing costs). Typical thicknesses of the capping layer 16 range within about 0.1 to about 10.0 microns, such as 0.5 to about 5.0 microns. Various techniques may be used for deposition of the capping layer 16, including physical vapor deposition, such as DC magnetron sputtering.

The stabilizer layer 18 is generally incorporated to overlie the superconductor layer 14, and in particular, overlie and directly contact the capping layer 16 in the particular embodiment shown in FIG. 1. The stabilizer layer 18 functions as a protection/shunt layer to enhance stability against harsh environmental conditions and superconductivity quench. The layer is generally dense and thermally and electrically conductive, and functions to bypass electrical current in case of failure of the superconducting layer. It may be formed by any one of various thick and thin film forming techniques, such as by laminating a pre-formed copper strip onto the superconducting tape, by using an intermediary bonding material such as a solder or flux. Other techniques have focused on physical vapor deposition, typically evaporation or sputtering, as well as wet chemical processing such as electroless plating, and electroplating. In this regard, the capping layer 16 may function as a seed layer for deposition of copper thereon.

While a generalized structure of a superconductor tape has been described above in connection with FIG. 1, additional, more detailed features of embodiments of the present invention are made clear in reference to the process flow shown in FIGS. 2-5, which show a patterning process for a long-length superconductive tape according to an embodiment of the present invention. According to the process shown, a photolithographic process is utilized to make a 3-dimensional pattern on the tape, utilizing a photoresist exposed to an energy source suitable for patterning, such as a wavelength within the visible light spectrum or ultraviolet spectrum. The process may generally begin with a priming process, in which the surface subjected to patterning is cleaned and primed. In this context, the tape may be vapor primed, by subjecting the tape, typically handled by a reel-to-reel process, to a dehydration baking step to remove absorbed moisture. In addition, a chemical prime may be carried out to promote adhesion of deposited photoresist to the superconductive tape, such as with HMDS. Chemical priming may be carried out utilizing various application methods. Additional priming methods include corona discharge treatment and plasma treatment.

Figure 2:
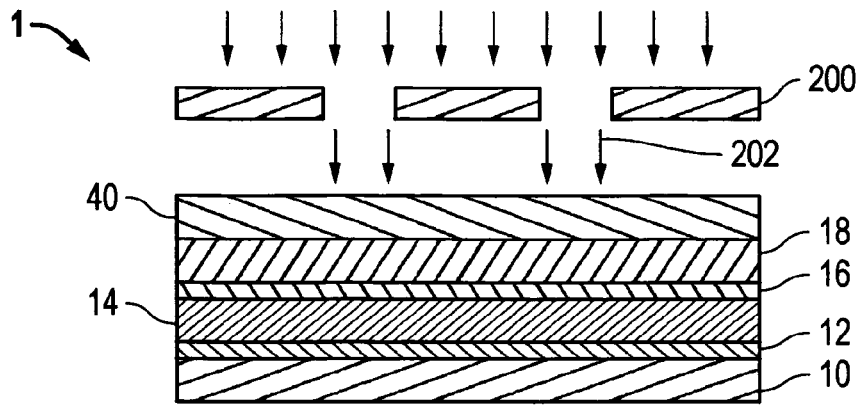
FIGS. 2-5 illustrate a process flow for forming an embodiment of the present invention.

Following any priming steps, generally a photoresist is then applied to the superconductive tape. In this regard, a photoresist layer 40 is shown in FIG. 2, overlying the superconductive tape formed of a layer structure including substrate 10, buffer layer 12, superconductor layer 14, capping layer 16 and stabilizer 18. The photoresist may be deposited by any one of various techniques, including thin and thick-film forming techniques, such as by dry film lamination dip and spray coating methods, and perhaps doctor blading. The actual composition of the photoresist may be chosen from any one of various commercially available photo-resists, such as those generally used in the semiconductor industry. An example includes an acrylate-based photoresist including standard UV I-line photo-resists. The photoresist may be a negative or positive resist. In this regard, a negative resist is one in which the image in the resist is the negative of the pattern found on the reticle used for patterning, while a positive resist forms an image having the same pattern formed in the reticle. Typically, advanced lithography techniques take advantage of positive resists.

Following a resist application, typically the resist is subjected to a soft bake operation in which any residual solvents in the resist are driven off and adhesion between the resist and the underlying superconductive tape is improved. A soft bake process may be carried out by stepping (a stop-and-go translation process) the superconductive tape over a hot plate, or by a continuous translation process over a hot plate or in an otherwise heated environment. Translation may be carried out by a reel-to-reel apparatus. In one embodiment, soft baking is carried out in a vacuum.

Figure 3:
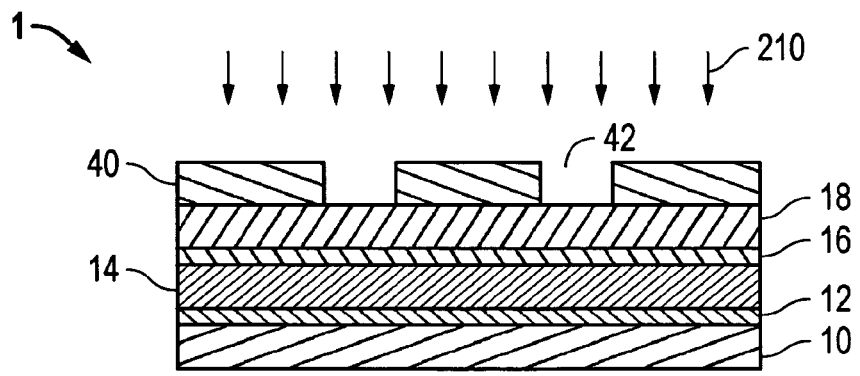

Following any baking operations, typically the photoresist is patterned via an alignment and exposure process. In this context, typically a reticle is used through which a light source at a desired frequency is positioned to expose selected portions of the photo-resist, either by a negative or positive photolithographic technique as referred to above. In this regard, attention is drawn to FIG. 2, arrows 200 illustrating selective exposure of photoresist 40, wherein a UV light source irradiates a reticle 200 permiting passage of only selected portions 202 to irradiate the photoresist layer 40. The illustrated embodiment utilizes a positive lithography approach, and the ultimate pattern formed in the photoresist layer 40 is the same pattern formed in reticle 200 as illustrated in FIG. 3.

As to the actual mechanics of carrying out alignment and exposure, the tape may be translated via a continuous process in which the reticle and light source are kept stationary for generally continuous radiation during the translation process. Alternatively, the reticle 200 may be sized so as to have an extended length, wherein the superconductive tape is translated, stopped, exposed, and translated again, referred to herein as a step-and-repeat process. For example, a reticle and source may be positioned so as to provide a 1 to 50 cm exposure window, for example, referring to the actual length of superconductive tape exposed in a single exposure step. By carrying out the foregoing process, the entire length of the superconductive tape is generally exposed prior to continuing on with photoresist development and etching described below.

Following exposure, the resist is developed. In the case of a positive photoresist, those portions of the resist that were exposed to light are dissolved in a developer solution. An example of one developer solution includes a 1% $Na_2CO_3$ aqueous solution. In the context of commercially available I-line resists, typically the most common developer is TMAH having various common formulations in the photolithographic industry. A fully developed resist is shown in FIG. 3, resist 40 having a plurality of channels 42 that expose portions of the underlying layers of the superconductive tape.

Following developing, the resist may be exposed to a hard bake, a thermal treatment in which any residual solvent from the developing process is evaporated and to harden the resist.

A superconductive tape is generally etched by an etchant 210 shown in FIG. 3. Etchant is generally used herein to include to a group of different etchant species that may be utilized for appropriate selectivity, etch rates and complete etching of various materials of the superconductive tape, which, in the embodiment shown, includes the materials of the stabilizing layer 18, capping layer 16, and superconductive layer 14. Etching may be carried out by one of various techniques, including by chemical and/or physical means. For example, dry etching generally exposes the superconductive tape to a plasma that interacts physically and/or chemically to remove exposed material of the tape. Wet etching utilizes liquid chemicals to chemically remove material from the superconductive tape. One embodiment utilizes wet etching, and more precisely, a copper chlorate solution ($CuCl_2$), generally containing a 10% aqueous solution of CuCl$_2$. As noted above, different chemistries may be utilized for the differing materials of the superconductive tape.

Figure 4:
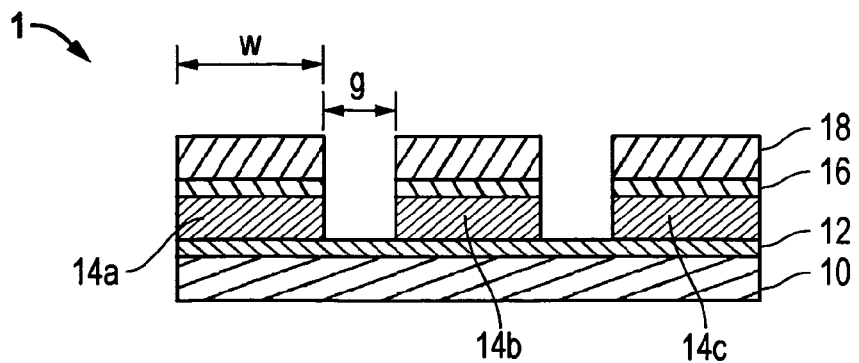

Following the etching operation, a structure is provided as show in FIG. 4, in which superconductive strips or filaments 14a, 14b, and 14c are left behind subsequent to the etching operation. As shown, the strips are spaced apart from each other by a gap g, and have a strip or filament width W, as illustrated. According to embodiments of the present invention, the strips are generally parallel to the longitudinal axis of the tape and generally parallel to each other and are generally spaced apart from each other by an average gap g of at least 1 micron, typically not less than about 5 microns, such as not less than about 10 microns. While a substantially constant gap is provided between the superconductive strips shown in FIG. 4, it is understood that a non-constant gap may be utilized between various adjacent strips of the superconductive tape.

Further, the superconductive strips may have an average width of not less than about 5 microns, and in one embodiment not less than about 8 microns, or even not less than about 10 microns. The superconductive strips may have substantially the same width or varying widths. Further, while embodiments shown are co-planar, it is to be understood that various levels or layers of superconductive material may be utilized thereby providing a structure in which the superconductive strips are not co-planar with each other.

Following etching, the resist is removed, such as exposing the resist to an appropriate aqueous solution. In one embodiment, the superconductive tape is exposed to NaOH in a 2-3 weight/weight % aqueous solution, followed by a DI rinse. Following exposure of the resist and rinsing, generally the superconductive tape is cleaned, such as by an O$_2$ plasma treatment.

Figure 5:
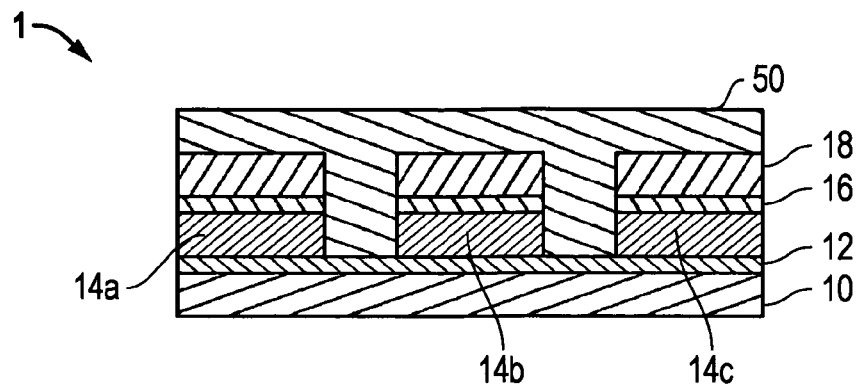

Following completion of the photolithographic patterning process, the superconductive tape may be subjected to further deposition operations to form additional layers. As shown in FIG. 5 the superconductive tape may be completed by deposition of a passivating layer 50, formed of a suitable passivating material which may serve various functions, including providing a protective barrier layer against contaminants to prevent undesirable contamination of the superconductive layer. The passivating layer 50 may also provide structural integrity to the superconductive tape. Examples of materials utilized for the passivating layer include SiO$_2$, YSZ, diamond-like carbon, organic polymers.

Figure 6:
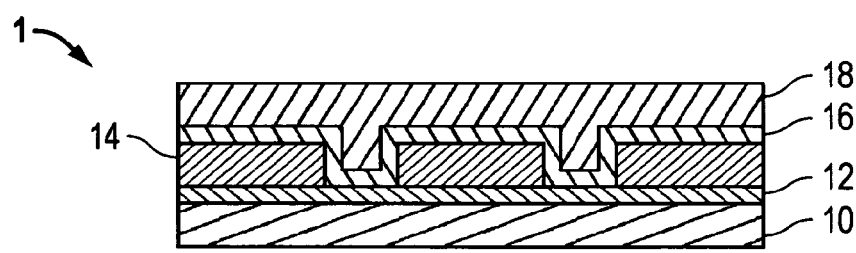
FIG. 6 illustrates another embodiment of the present invention.

While in the foregoing embodiment disclosed in connection with the process flow shown in FIGS. 2-5, patterning by a photolithographic technique is carried out after formation of capping layer 16 and stabilizing layer 18, it is noted that patterning may be carried out prior to deposition of such layers. In this context, attention is drawn to FIG. 6 in which the superconductor layer 14 is patterned prior to formation of capping layer 16 and stabilizing layer 18. As shown, the capping layer 16 may be relatively conformal and the stabilizing layer provided in a non-conformal architecture.

Figure 7:
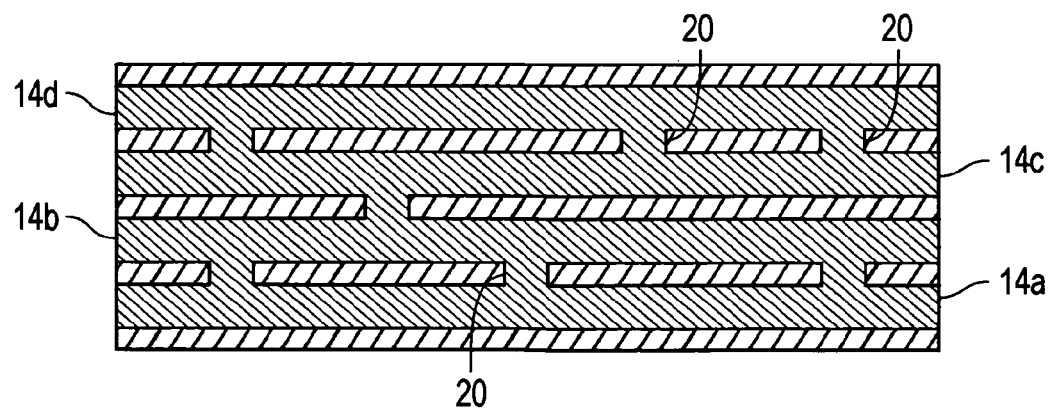
FIG. 7 illustrates a top view showing a superconductor tape layout according to an aspect of the present invention.

While various features of embodiments of the present invention have be disclosed above with particular detail regarding various process features, attention is also drawn to FIG. 7 illustrating a top-view of the architecture of superconducting filaments according to an embodiment of the present invention. Here, the plurality of filaments 14a, 14b, 14c, and 14d are provided, in which a plurality of bridges 20 are provided. In one embodiment, the bridges 20 are formed from the same superconductive layer 14, as disclosed above in connection with the process flow shown in FIGS. 2-5. Accordingly, the conductive bridges are generally formed with the same superconductive material as the balance of the layer 14, namely the superconductive strips. These bridges or bridging filaments 20 may be provided to improve the manufacturing process yield of superconductive tape. More particularly, opens or gaps in conductive filaments negatively impact yield. By utilizing bridging filaments 20 as shown in FIG. 7, which may be periodically arranged between adjacent superconductive strips, discrete lengths of superconductive strips containing opens may be shunted. Typically, the superconductive tape includes at least one bridge between two adjacent filaments for every 100 m of substrate, more typically, at least one per 50 m of substrate, and in various embodiments at least one per 10 m of substrate. Other embodiments include at least one bridge per every 1 m of substrate. While typically, the conductive bridges are spaced apart periodically along the length of the substrate, the conductive bridges may be randomly oriented or non-periodically arranged. As to the integration of the formation of the conductive bridges, such bridges may be easily formed contemporaneously with the patterning processes described above.

Beyond the particular architecture and process techniques in connection with superconductive conductors or tapes as described above, embodiments are also direct to components, such as industrial or commercial power components incorporating such conductors. Certain embodiments are drawn to a class of power components known as 'rotating machines,' which broadly includes power generators and motors.

Figure 8:
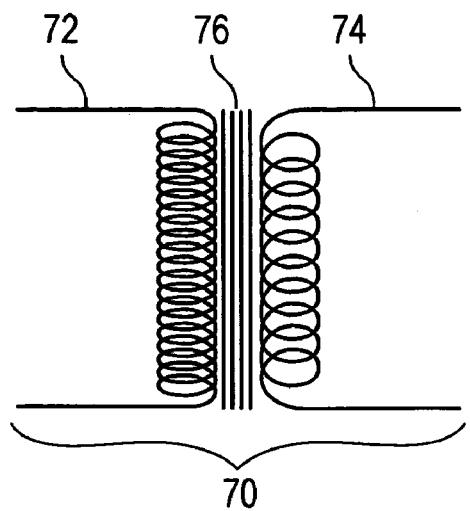
FIG. 8 illustrates a schematic view of a transformer.
Figure 9:
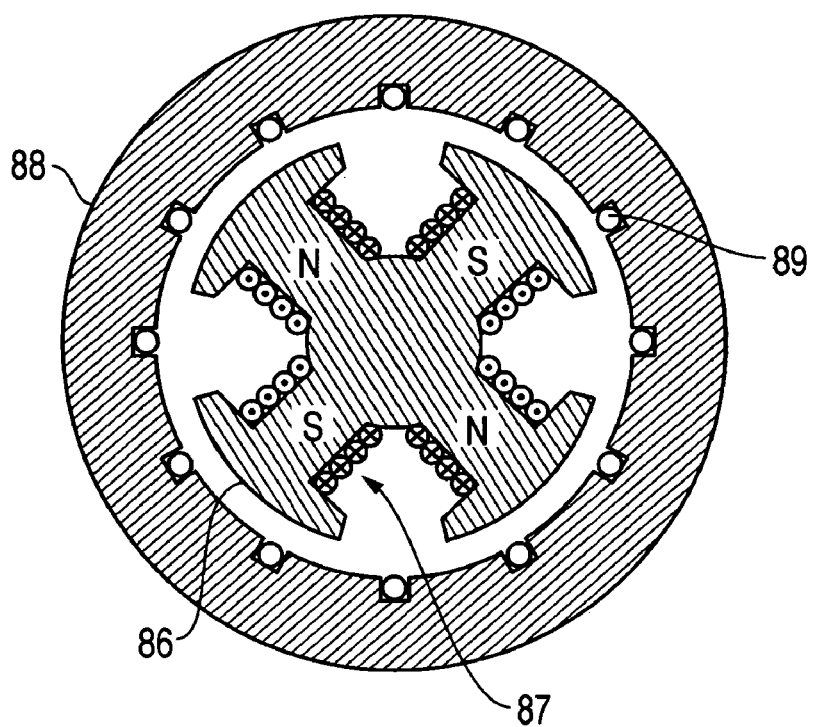
FIG. 9 illustrates a schematic view of a power generator.

FIG. 8 illustrates schematically a power transformer having a central core 76 around which a primary winding 72 and a secondary winding 74 are provided. It is noted that FIG. 8 is schematic in nature, and the actual geometric configuration of the transformer may vary as is well understood in the art. However, the transformer includes at least the basic primary and secondary windings. In this regard, in the embodiment shown in FIG. 8, the primary winding has a higher number of coils than the secondary winding 74, representing a step-down transformer that reduces voltage of an incoming power signal. In reverse, provision of a fewer number of coils in the primary winding relative to the secondary winding provides a voltage step-up. In this regard, typically step-up transformers are utilized in power transmission substations to increase voltage to high voltages to reduce power losses over long distances, while step-down transformers are integrated into distribution substations for later stage distribution of power to end users. At least one of and preferably both the primary and secondary windings comprise superconductive tapes in accordance with the foregoing description Turning to FIG. 9, the basic structure of a generator is provided. The generator includes a rotor 86 that is driven as is known in the art, such as by a turbine. Rotor 86 includes high-intensity electromagnets, which are formed of rotor coils 87 that form the desired electromagnetic field for power generation. The generation of the electromagnetic field generates power in the stator 88, which comprises at least one conductive winding 89. According to a particular feature of the embodiment, the rotor coils and/or the stator winding comprises a superconductive tape in accordance with embodiments described above. Low loss superconductors used in the stator windings generally substantially reduce hysteresis losses.

While particular aspects of the present invention have been described herein with particularity, it is well understood that those of ordinary skill in the art may make modifications hereto yet still be within the scope of the present claims.

What is claimed is:

1. A superconducting article, comprising:
   a substrate having a length, a width and a longitudinal direction, wherein the length is at least about 100 meters, the length is greater than the width, and the longitudinal direction extends along the length; and
   a layer of superconductor material overlying the substrate, said layer comprising a plurality of superconductor strips and a plurality of superconductive bridges coplanar with the plurality of superconductive strips, wherein (i) the plurality of superconductor strips extend along a longitudinal direction, the superconductor strips comprising a first, a second, and a third superconductor strips extending parallel to each other along the longitudinal direction, being coextensive with each other along at least a portion of the length, and the first and second superconductor strips and the second and third superconductor strips being spaced apart from each other along the width by a first and a second gap respectively, the first and second gaps having a length extending parallel to the longitudinal direction; and (ii) the plurality of superconductive bridges electrically connecting at least the first, second, and third superconductor strips with each other and spanning the first and second gaps, the plurality of superconductive bridges being provided such that at least one superconductive bridge is present per 10 meters of length of the substrate, wherein the substrate has a dimension ratio of not less than about 10.

2. The superconducting article of claim 1, wherein the superconductor strips are spaced apart from each other by an average gap width of at least 1 µm.

3. The superconducting article of claim 2, wherein said average gap width is not less than about 5 µm.

4. The superconducting article of claim 2, wherein the superconductor strips are spaced apart from each other by a substantially constant gap.

5. The superconducting article of claim 4, wherein the first and second superconductor strips have substantially the same width.

6. The superconducting article of claim 1, wherein the first and the second superconductor strips have an average width of at least 5 µm.

7. The superconducting article of claim 1, wherein the superconductor layer is formed by deposition to overlie the substrate.

8. The superconducting article of claim 1, wherein the superconductor layer is subjected photolithographic processing to form the superconductive strips.

9. The superconducting article of claim 8, wherein the photolithographic processing is effective to remove portions of the superconductor layer, leaving behind the superconductor strips.

10. The superconducting article of claim 1, further comprising at least one conductive shunt layer overlying the superconductor layer.

11. The superconducting article of claim 1, further comprising a biaxially textured layer, over which the superconductor layer is provided.

12. The superconducting article of claim 11, wherein the biaxially textured layer comprises an IBAD layer.

13. The superconducting article of claim 1, wherein the layer of superconductor material is comprised of a high temperature superconductor.

14. The superconducting article of claim 13, wherein the high temperature superconductor comprises $REBa_2Cu_3O_{7-x}$, wherein RE is a rare earth element.

15. The superconducting article of claim 14, wherein the superconductor material comprises $YBa_2Cu_3O_7$.

16. The superconducting article of claim 1, wherein the substrate has a dimension ratio of not less than $10^2$.

17. The superconducting article of claim 1, wherein the substrate has a dimension ratio of not less than $10^3$.

18. The superconducting article of claim 1, wherein the article is in the form of a superconducting tape.

19. The superconducting article of claim 1, wherein the substrate, the superconductive strips, and the plurality of superconductive bridges form a superconductive tape, the article comprising a coil having a plurality of superconductive tapes.

20. The superconducting article of claim 1, wherein the article is a power transformer, the power transformer comprising at least a primary winding and a secondary winding, wherein at least one of the primary winding and secondary winding comprises a wound coil of superconductive tape, the superconductive tape comprising said substrate, said superconductor strips, and said plurality of superconductive bridges.

21. The superconducting article of claim 1, wherein the article is a rotating machine, the rotating machine comprising at least one winding, wherein the at least one winding comprises a superconductive tape formed of said substrate, said superconductor strips, and said plurality of superconductive bridges.

22. The superconducting article of claim 21, wherein the rotating machine is a power generator or motor.

23. The superconducting article of claim 1, wherein the entirety of the bridge connecting the superconducting strips is superconductive.

24. A superconducting article, comprising:
   a substrate having a length, a width and a longitudinal direction, wherein the length is at least about 100 meters, the length is greater than the width, and the longitudinal direction extends along the length; and
   a layer of superconductor material overlying the substrate, said layer comprising a plurality of superconductor strips and a plurality of superconductive bridges coplanar with the plurality of superconductive strips, wherein (i) the plurality of superconductor strips extend along a longitudinal direction, the superconductor strips comprising first second, and third superconductor strips extending parallel to each other along the longitudinal direction, being coextensive with each other along at least a portion of the length, and the first and second superconductor strips and the second and third superconductor strips being spaced apart from each other alone the width by a first and a second gap respectively, the first and second gaps having a length extending parallel to the longitudinal direction; and (ii) the plurality of superconductive bridges electrically connecting at least the first, second, and third superconductor strips with each other and spanning the first and second gaps, the plurality of superconductive bridges being provided such that at least one superconductive bridge is present per 1 meter of length of the substrate, wherein the substrate has a dimension ratio of not less than about 10.

* * * * *